United States Patent
Nystrom et al.

(10) Patent No.: US 9,238,365 B1
(45) Date of Patent: Jan. 19, 2016

(54) FLEX CIRCUIT BOARD WITH TOPOGRAPHICAL STRUCTURES TO FACILITATE FLUID FLOW THROUGH THE LAYER

(71) Applicant: Xerox Corporation, Norwalk, CT (US)

(72) Inventors: Peter J. Nystrom, Webster, NY (US); Gary D. Redding, Victor, NY (US); Mark A. Cellura, Webster, NY (US); Jon G. Judge, Tigard, OR (US); Chad D. Freitag, Portland, OR (US); Samuel V. Schultz, Portland, OR (US); Chad J. Slenes, Sherwood, OR (US)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 14/454,186

(22) Filed: Aug. 7, 2014

(51) Int. Cl.
*B41J 2/14* (2006.01)
*B41J 2/16* (2006.01)
*H05K 1/02* (2006.01)

(52) U.S. Cl.
CPC .............. *B41J 2/14201* (2013.01); *H05K 1/028* (2013.01); *H05K 2201/0154* (2013.01)

(58) Field of Classification Search
CPC .............. B41J 2/14072; B41J 2/17526; B41J 2/14201; B41J 2002/14491; B41J 2002/14201
See application file for complete search history.

(56) References Cited

U.S. PATENT DOCUMENTS

| 8,092,000 B2 | 1/2012 | Alavizadeh et al. |
| 8,562,114 B2 | 10/2013 | Gerner et al. |
| 2012/0210580 A1 | 8/2012 | Dietl |

*Primary Examiner* — Juanita D Jackson
(74) *Attorney, Agent, or Firm* — Maginot Moore & Beck LLP

(57) ABSTRACT

A flex circuit board provides islands of electrically isolated material surrounding openings in the flex circuit board to preserve fluid integrity of passageways passing through an electrically insulating layer of the flex circuit board. The electrically isolated islands surround exits of the passageways through the electrically insulating material and extend the passageways through an electrically conductive layer of the flex circuit board. Consequently, fluid passing through the passageways and electrically isolated islands in the flex circuit board is not subjected to electrical current.

18 Claims, 2 Drawing Sheets

FLEX CIRCUIT BOARD WITH TOPOGRAPHICAL STRUCTURES TO FACILITATE FLUID FLOW THROUGH THE LAYER

TECHNICAL FIELD

This disclosure relates generally to inkjet printers, and, in particular, to flex circuits for connecting actuators to firing signals for operating printheads used in such printers.

BACKGROUND

Printheads in inkjet printers are typically formed with a plurality of layers that are laminated together to form the printhead. Each printhead is fluidly connected to one or more ink sources to enable liquid ink to flow into the printhead. The liquid ink then moves through passageways formed in the layers to a plurality of chambers, each of which is opposite an actuator, such as a piezoelectric transducer. When the actuators are activated by an electrical driving signal, a diaphragm is deflected with reference to the chamber to eject a drop of ink from the chamber through a nozzle. By selectively activating the actuators, ink drops are ejected to form an ink image on an ink receiving surface. Typically, a flex circuit layer is formed with electrical traces that are operatively connected to a driving signal circuit to deliver the electrical driving signals to the actuators.

The passageways in a laminated printhead are formed by aligning passageway openings in adjacent layers to enable ink to exit a passageway in one layer and enter a passageway in the next layer. Consequently, the alignments and tolerances for the distances between openings in adjacent layers are tight to prevent ink from escaping the passageways and migrating along other features in the printhead. One layer that can present issues with these tolerances is the flex circuit board. A flex circuit board includes a foundational flexible material with a pattern of an electrical conductor, such as copper, on one surface of the foundational material. The electrical conductor pattern can be produced on the foundational material using either an additive process or a subtractive process. The height differences between the electrical conductor pattern and the exposed foundational material enable ink to seep out the passageways through the foundational flexible material before it enters the passageway in the next layer. Preserving the integrity of ink passageways through a flex circuit board would be beneficial

SUMMARY

In order prevent ink leakage from passageways through a flex circuit board in a laminated printhead, a flex circuit board has been formed with electrical traces that better preserve the fluid integrity of the passageways though the foundation layer of the flex circuit board and the layer of the printhead adjacent to the flex circuit board. The flex circuit board includes a layer of electrically insulating material, the layer of electrically insulating material having at least one passageway through the layer, and a layer of electrically conductive material, the layer of electrically conductive material forming an electrical circuit and having at least one electrically isolated island with an opening that extends through the at least one electrically isolated island, the opening in each at least one electrically isolated island aligns with and extends one of the at least one passageway in the layer of electrically insulating material in a one-to-one correspondence.

A laminated printhead can be formed with the flex circuit board having the structure that preserves the height of the electrical conductor layer in areas adjacent the passageways through the foundational layer of the flex circuit board. The laminated printhead includes a diaphragm layer having a plurality of openings through the diaphragm layer, a plurality of actuators arranged in a predetermined pattern on the diaphragm layer, and a flex circuit board further comprising: a layer of electrically conductive material, the layer of electrically conductive material having a plurality of electrically conductive paths and having a plurality of electrically isolated islands, each electrically isolated island having an opening that extends through the electrically isolated island, each electrical conductive path being configured to provide an electrical signal connection to one of the actuators in a one-to-one correspondence to enable electrical activation of each actuator, and each electrically isolated island being configured to be electrically isolated from the plurality of electrical conductive paths to prevent each electrically isolated island from being connected to an electrical signal source, and a layer of electrically insulating material having a plurality of passageways through the layer of electrically insulating material, each passageway through the layer of electrically insulating material being aligned with one opening in the plurality of electrically isolated islands and with one passageway through the diaphragm layer in a one-to-one-to-one correspondence to enable fluid flow through the diaphragm layer, the layer of electrically insulating material, the layer of electrically conductive material, and the diaphragm layer.

Another embodiment of the laminated printhead includes a diaphragm layer, a plurality of actuators arranged in a predetermined pattern on the diaphragm layer, and a flex circuit board further comprising: a layer of electrically conductive material, the layer of electrically conductive material having a plurality of electrically conductive paths and having at least one electrically isolated island with an opening that extends through the at least one electrically isolated island, each electrical conductive path being configured to provide an electrical signal connection to one of the actuators in a one-to-one correspondence to enable electrical activation of each actuator, and each at least one electrically isolated island with the opening being configured to be electrically isolated from the plurality of electrical conductive paths to prevent the at least one electrically isolated island with the opening from being connected to an electrical signal source, and a layer of electrically insulating material having at least one passageway, each at least one passageway through the layer of electrically insulating material being in a one-to-one correspondence with the opening in each at least one electrically isolated island to enable each passageway in the at least one passageway in the layer of electrically insulating material to be aligned with one opening in the at least one electrically isolated island on the layer of electrically conductive layer in a one-to-one correspondence.

BRIEF DESCRIPTION OF THE DRAWINGS

The foregoing aspects and other features of the present disclosure are explained in the following description, taken in connection with the accompanying drawings.

DETAILED DESCRIPTION

Figure 1:
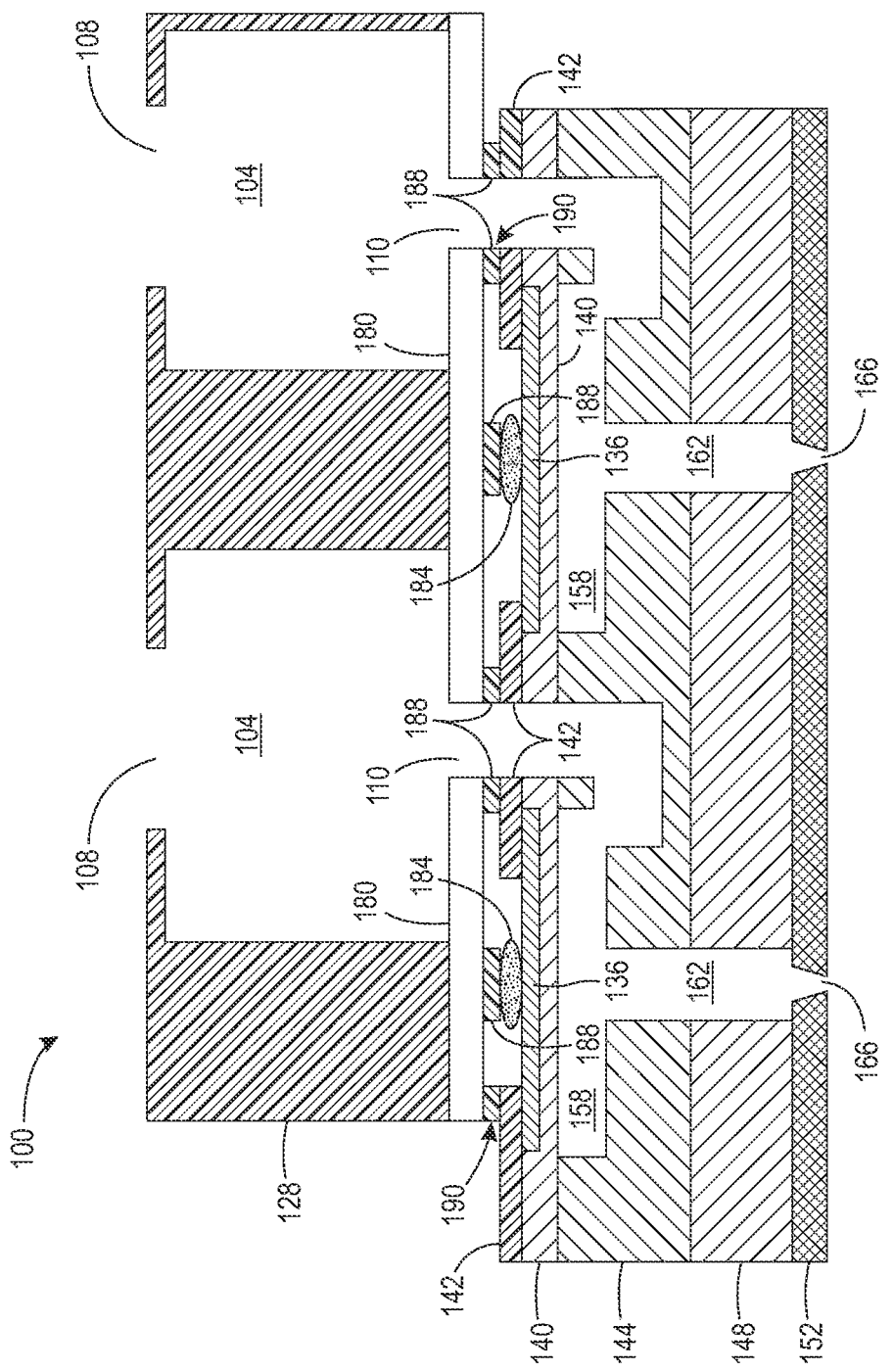
FIG. 1 is a cross-sectional view of a laminated printhead having a flex circuit board that preserves the integrity of passageways through the flex circuit board and electrically isolates the fluid in the passageways from electrical current.

For a general understanding of the present embodiments, reference is made to the drawings. In the drawings, like reference numerals have been used throughout to designate like elements.

As used herein, the term "printer" generally refers to a device for producing an ink image on print media. "Print media" can be a physical sheet of paper, plastic, or other suitable physical material that provides a surface for receiving ejected ink and forming ink images. The printer may include a variety of other components, such as finishers, paper feeders, and the like, and may be embodied as a copier, fax machine, or a multifunction machine. An ink image corresponds to image data stored in a memory in electronic form. The image data are rendered to generate electrical driving signals that are electrically connected to actuators to eject ink from one or more printheads to form an ink image on print media. The image data are rendered by a marking engine and such image data may include text, graphics, pictures, and the like.

For a general understanding of the environment for the system and method disclosed herein as well as the details for the system and method, reference is made to the drawings. In the drawings, like reference numerals have been used throughout to designate like elements. As used herein, the word "printer" encompasses any apparatus that performs a print outputting function for any purpose, such as a digital copier, bookmaking machine, facsimile machine, a multifunction machine, etc. In the description below, reference is made in the text and the drawings to an ink jet stack; however, the discussion is applicable to other micro-fluidic devices that dispense liquid or pump fluid. Therefore, the description should not be read to limit the application of the method to ink jet stacks alone.

Figure 2:
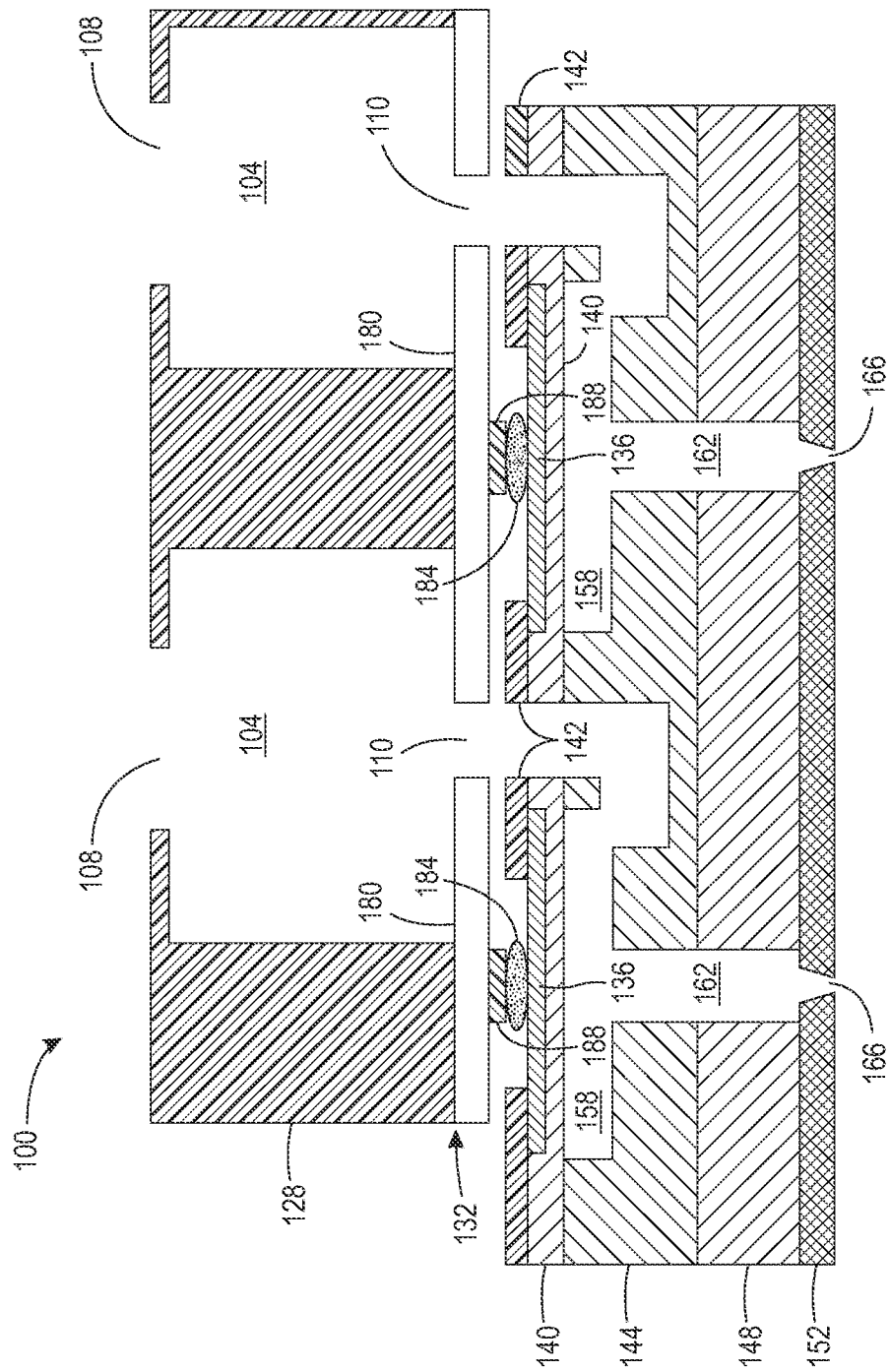
FIG. 2 is a cross-sectional view of a prior art laminated printhead having a flex circuit board that enables fluid passing through passageways in a flex circuit board to seep into other areas of the printhead and to contact electrical current in the printhead.

FIG. 2 depicts a prior art embodiment of an inkjet stack in a laminated printhead in which an inkjet stack assembly 100 is attached to an external manifold 128. The manifold 128 forms one or more chambers 104 that store ink before the ink flows into a pressure chamber 158 via the manifold outlet 110. The pressure chamber 158 holds ink until a piezoelectric transducer 136 has an electric current applied, causing it to bend a flexible diaphragm 140 in the direction of the pressure chamber. The diaphragm 140 is attached to the bottom of the piezoelectric transducer 136, and in the orientation of FIG. 2 the piezoelectric transducer's bottom faces towards the pressure chamber 158. The diaphragm 140 forms a wall of the pressure chamber, and when it bends in response to the deformation of the piezoelectric transducer, the ink in the pressure chamber is urged into an outlet channel 162 before leaving the inkjet stack as a droplet via aperture 166. The pressure chamber 158 is formed within a body layer 144, typically by etching a channel in the body layer. The body layer 144 is placed above an outlet layer 148, which has outlet channels 162 formed within it. In one typical embodiment, the body layer 144 and outlet layer 148 are metal sheets that may be brazed together. As known in the art, the layers 144 and 148 can be comprised of multiple layers. The outlet layer 148 is placed above an aperture plate 152. In typical embodiments, the aperture plate may be formed from metal or a polymer, and the apertures 166 formed in the aperture plate 152 are aligned with the outlet channels 162 in the outlet layer 148. FIG. 2 also shows an adhesive film layer 142.

Referring specifically to FIG. 2, the prior art embodiment shows a manifold layer 128 that receives ink through an inlet 108 for temporary storage in the manifold chamber 104. The flex circuit board 132 is flexible electrical circuit board that is configured to deliver electrical firing signals to the transducers 136. The flex circuit board 132 includes a base or foundational layer of electrically insulating material 180 and an electrically conductive layer 188. The electrically conductive layer 188 is an electrical conductor pattern produced on the foundational layer 180 by either an additive or subtractive process as is well known. An electrically conductive adhesive 184 is then applied to the transducers 136 and the electrical conductor pattern of the electrically conductive layer 188 on the flex circuit board 132 is bonded to the transducers 136.

As can been seen from FIG. 2, the gap between the foundational layer 180 and the adhesive film layer 142 provides partial paths of egress from manifold outlet 110. Fluid flowing into these areas can seep between other layers and possibly affect the operation of the laminated printhead adversely. Additionally, fluid that contacts the electrical conductor pattern of the electrically conductive layer 188 is exposed to electrical current, and, in some fluids, the electrical current can break down the fluid or enable the fluid to take on some etching characteristics, which may also adversely impact the operation of the laminated printhead.

A laminated printhead having a flex circuit board 190 that attenuates the effects caused by the flex circuit boards 132 of previously known printheads is shown in FIG. 1. Using like reference numbers for like elements, the structure of the printhead follows the description set forth above with the following exceptions. In the embodiment shown in FIG. 1, the electrically conductive layer 188 is configured to leave islands of electrically conductive material on the electrically conductive layer 188 with openings to enable the islands to surround completely the exit of the passageway through the base layer 180 and extend that passageway through the electrically conductive layer 188 of the flex circuit board 190. This extended passageway is aligned with manifold outlet 110 when the flex circuit board 190 of this embodiment is bonded to the transducers 136 with the conductive adhesive 184. Thus, these islands of the electrically conductive layer 188 block any diversion of fluid from the fluid path between the manifold outlet 110 and the pressure chamber 158. The islands of the electrically conductive layer 188 left to surround and extend the passageway through the base layer 180 are configured so they do not contact the transducer 136 and are electrically insulated from the electrically conductive pattern formed in the electrically conductive layer 188 of the flex circuit board 190. Consequently, the fluid passing through the manifold outlet 110 and flex circuit board 190 to the pressure chamber 158 does not contact an electrical current so the potentially adverse consequences of such contact do not occur.

As used in this document, "electrically isolated islands of electrically conductive material" refers to discrete portions of the electrically conductive layer of a flex circuit board that are not in electrical continuity with an electrical conductive path formed elsewhere with the electrically conductive layer. Also, "flex circuit board" refers to any foundation or base layer having an electrically conductive layer on its surface that is capable of some degree of bending. The term "actuator" refers to any transducer material configured to be activated by an electrical signal to eject a drop of fluid. These actuators include piezoelectric and thermal actuators. The electrically insulating material of the base layer can be a polymeric layer, such as a layer of thermoplastic polyimide, polyester, polysulfone, polyetheretherketone, polyphenelyene sulfide, or polyethersulfone. The electrically conductive material includes layers of conductive metals and the like, such as those in the group of copper, copper alloys, tin plated copper, and gold plated copper. "Adhesive layers" include double sided adhesive tapes having thermoset or thermoplastic adhesive layers on opposite sides of a thermoset or thermoplastic polymer core; dispensed liquid adhesive or a transfer film of liquid adhesive; thermoplastic or thermoset adhesives; and the like.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A flex circuit board comprising:
    a layer of electrically insulating material, the layer of electrically insulating material having at least one passageway through the layer; and
    a layer of electrically conductive material, the layer of electrically conductive material forming an electrical circuit and having at least one electrically isolated island of electrically conductive material with an opening that extends through the at least one electrically isolated island, the opening in each at least one electrically isolated island of electrically conductive material aligns with and extends one of the at least one passageway in the layer of electrically insulating material in a one-to-one correspondence.

2. The flex circuit board of claim 1 wherein the layer of electrically insulating material is a layer of polymeric material.

3. The flex circuit board of claim 2 wherein the layer of polymeric material is a layer of polyimide.

4. The flex circuit board of claim 1 wherein the layer of electrically conductive material is a layer of copper.

5. The flex circuit board of claim 1 wherein the layer of electrically conductive material is a layer of a material selected from the group comprising copper and copper alloy.

6. A laminated printhead comprising:
    a diaphragm layer;
    a plurality of actuators arranged in a predetermined pattern on the diaphragm layer; and
    a flex circuit board further comprising:
        a layer of electrically conductive material, the layer of electrically conductive material having a plurality of electrically conductive paths and having at least one electrically isolated island with an opening that extends through the at least one electrically isolated island, each electrical conductive path being configured to provide an electrical signal connection to one of the actuators in a one-to-one correspondence to enable electrical activation of each actuator, and each at least one electrically isolated island with the opening being configured to be electrically isolated from the plurality of electrical conductive paths to prevent the at least one electrically isolated island with the opening from being connected to an electrical signal source; and
        a layer of electrically insulating material having at least one passageway, each at least one passageway through the layer of electrically insulating material being in a one-to-one correspondence with the opening in each at least one electrically isolated island to enable each passageway in the at least one passageway in the layer of electrically insulating material to be aligned with one opening in the at least one electrically isolated island on the layer of electrically conductive layer in a one-to-one correspondence.

7. The laminated printhead of claim 6 wherein the layer of electrically insulating material is a layer of polymeric material.

8. The laminated printhead of claim 7 wherein the layer of polymeric material is a layer of polyimide.

9. The laminated printhead of claim 6 wherein the layer of electrically conductive material is a layer of copper.

10. The laminated printhead of claim 6 wherein the layer of electrically conductive material is a layer of a material selected from the group comprising copper and copper alloy.

11. A laminated printhead comprising:
    a diaphragm layer having a plurality of openings through the diaphragm layer;
    a plurality of actuators arranged in a predetermined pattern on the diaphragm layer; and
    a flex circuit board further comprising:
        a layer of electrically conductive material, the layer of electrically conductive material having a plurality of electrically conductive paths and having a plurality of electrically isolated islands, each electrically isolated island having an opening that extends through the electrically isolated island, each electrical conductive path being configured to provide an electrical signal connection to one of the actuators in a one-to-one correspondence to enable electrical activation of each actuator, and each electrically isolated island being configured to be electrically isolated from the plurality of electrical conductive paths to prevent each electrically isolated island from being connected to an electrical signal source; and
        a layer of electrically insulating material having a plurality of passageways through the layer of electrically insulating material, each passageway through the layer of electrically insulating material being aligned with one opening in the plurality of electrically isolated islands and with one passageway through the diaphragm layer in a one-to-one-to-one correspondence to enable fluid flow through the diaphragm layer, the layer of electrically insulating material, the layer of electrically conductive material, and the diaphragm layer.

12. The laminated printhead of claim 11 wherein the layer of electrically insulating material is a layer of polymeric material.

13. The laminated printhead of claim 12 wherein the layer of polymeric material is a layer of polyimide.

14. The laminated printhead of claim 11 wherein the layer of electrically conductive material is a layer of copper.

15. The laminated printhead of claim 11 wherein the layer of electrically conductive material is a layer of tin plated copper.

16. The laminated printhead of claim 11 wherein the layer of electrically conductive material is a layer of an gold plated copper.

17. The laminated printhead of claim 11 wherein the layer of electrically conductive material is a layer of copper alloy.

18. The laminated printhead of claim 11 wherein each actuator in the plurality of actuators is a piezoelectric actuator.

* * * * *